United States Patent [19]

Sinnadurai et al.

[11] Patent Number: 4,595,096

[45] Date of Patent: * Jun. 17, 1986

[54] INTEGRATED CIRCUIT CHIP CARRIER

[75] Inventors: F. Nihal Sinnadurai, Woodbridge; Anthony J. Cook, Dippenhall, Nr Farnham; Keith W. Gurnett, Bracknell, all of England

[73] Assignee: British Telecommunications, London, England

[*] Notice: The portion of the term of this patent subsequent to May 15, 2001 has been disclaimed.

[21] Appl. No.: 563,622

[22] Filed: Dec. 20, 1983

Related U.S. Application Data

[62] Division of Ser. No. 342,358, Jan. 25, 1982, Pat. No. 4,448,306.

[30] Foreign Application Priority Data

Feb. 9, 1981 [GB] United Kingdom ................ 8103840

[51] Int. Cl.[4] ...................... B65D 73/02; B65D 85/42
[52] U.S. Cl. .................................. 206/331; 206/332; 206/334
[58] Field of Search ............... 206/331, 329, 328, 330, 206/332, 334

[56] References Cited

U.S. PATENT DOCUMENTS

| 3,349,481 | 10/1967 | Karp | 206/329 |
|---|---|---|---|
| 4,061,405 | 12/1977 | Minter | 206/329 |
| 4,099,615 | 7/1978 | Lemke et al. | 206/328 |
| 4,223,368 | 9/1980 | Dattilo | 206/328 |
| 4,227,298 | 10/1980 | Keeling et al. | 206/329 |
| 4,329,642 | 5/1982 | Luthi et al. | 206/328 |
| 4,448,306 | 5/1984 | Sinnadurai et al. | 206/331 |

FOREIGN PATENT DOCUMENTS 53-84681 7/1978 Japan.
53-114067 10/1978 Japan.

OTHER PUBLICATIONS

Proceedings of technical program, National Electronic Packaging and Production Conference of 1977, pp. 57-64: "Mini-PAK A Cost Effective Leadless Chip Carrier".

Primary Examiner—Joseph Man-Fu Moy
Attorney, Agent, or Firm—Cushman, Darby & Cushman

[57] ABSTRACT

An integrated circuit chip carrier is made of plastics material, such as glass/epoxy printed circuit board material, and comprises a base and a side wall attached to the top surface of the base to define a chip mounting cavity. Conductor tracks on the base extend from connecting pads inside the cavity to connecting points on the periphery of the carrier. The chip carrier can be fabricated as one of an array of such carriers for subsequent separation.

6 Claims, 2 Drawing Figures

INTEGRATED CIRCUIT CHIP CARRIER

This is a division of application Ser. No. 342,358 filed Jan. 25, 1982, now U.S. Pat. No. 4,448,306.

BACKGROUND OF THE INVENTION

The invention relates to the field of integrated circuit chip carriers. Chip carriers provide an alternative method of packaging integrated circuit chips to the well-known dual in-line package (DIP).

Known forms of chip carrier consist of a usually rectangular base of ceramic material. A central area on the base is provided, on to which an integrated circuit chip or die is mounted and secured, for example using an epoxy resin adhesive. Leads are then connected between the appropriate points on the die to metal bonding pads provided on the carrier base. A preformed metallization pattern on the carrier base connects the bonding pads to terminal contacts formed around the periphery of the base. A metal or ceramic lid is then secured over the base so as to enclose and protect the die. The ceramic chip carrier is therafter mounted on a printed circuit board together with a series of other chip carriers and electronic components that go to form the complete circuit.

The use of ceramic material for the chip carrier is expensive and problems can also arise when the ceramic base is later bonded to a conventional epoxy/glass printed circuit board, due to the differential expansion between the two materials. In extreme environmental conditions the ceramic chip carrier can break away from the printed circuit board.

BRIEF SUMMARY OF THE INVENTION

The invention provides a chip carrier having a plastics base and a plastics side wall connected to the top surface of the base. The side wall extends around the periphery of the chip carrier to define a chip mounting cavity. Conductive tracks formed on the base extend from connecting pads in the cavity to connecting points on the periphery of the chip carrier.

The cavity may be filled with a layer of protective coating material and, furthermore, the chip carrier may be provided with a lid, thus providing the integrated circuit chip with mechanical protection and protection in conditions of high humidity.

Because the chip carrier is made of the same (or a similar) material as a conventional epoxy/glass printed circuit board, the problem of differential expansion is not encountered.

DESCRIPTION OF PREFERRED EMBODIMENT

Figure 1:
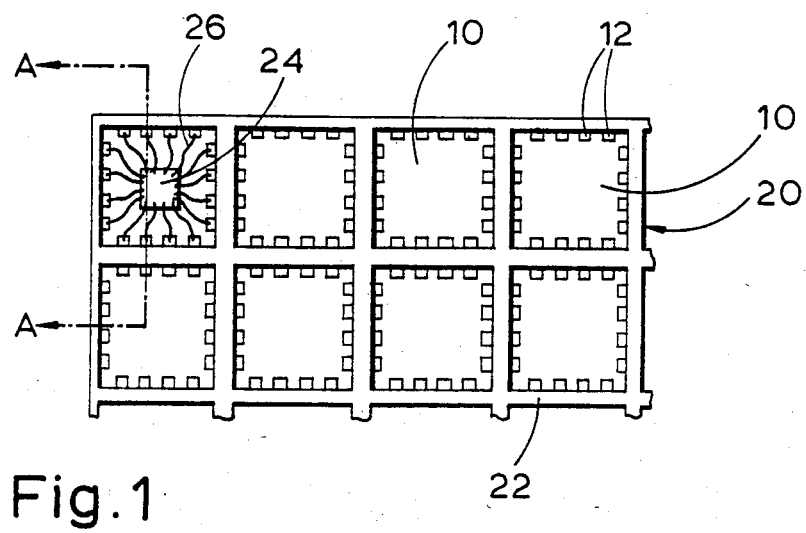
FIG. 1 is a plan view of part of an array of chip carriers before separation, shown at approximately three times actual size.

A series of chip carriers according to the invention are formed from a base sheet 10 of a plastics material, for example glass reinforced epoxy resin such as is conventionally used in printed circuit board manufacture.

The base sheet 10 is formed with a series of rectangular arrays of metal pads 12, each of the arrays defining an individual chip carrier. A series of holes are formed in the sheet 10, one of which is shown at 14 in FIG. 2. A plated-through metallization 16 formed in each of the holes 14 connects each of the pads 12 to a corresponding pad 18 on the underside of the sheet 10. The pads 12 and 18 and the plated-through metallization 16 are all formed by conventional techniques used in printed circuit board manufacture, and are preferably formed of copper plated with gold or a nickel-gold alloy.

A grid 20 formed of the same material as the base 10, is bonded to the base 10, the arms 22 of the grid extending over the lines of holes 14 and over the portion on the metallization 16 formed on the upper surface of the base 10.

A series of integrated circuit dice 24 are then bonded on to base 10 in the centre of each of the arrays formed by the pads 12. Only a single die 24 is shown in FIG. 1 but it is to be understood that a die will be mounted in each of the eight illustrated arrays. The die 24 is preferably bonded to the base 10 by means of an epoxy adhesive compatible with the material of the base 10. Leads 26 are then connected between the appropriate points on the die 24 and each of the pads 12, in a process known as "wire bonding". The number and disposition of the pads 12 can be determined in advance so as to correspond to the external connections on the die 24.

Figure 2:
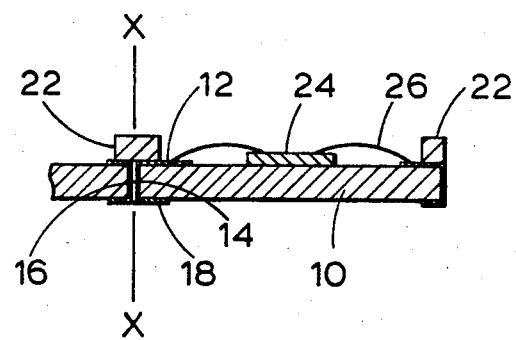
FIG. 2 is an enlarged cross-sectional view taken along the line A—A of FIG. 1.

It can be seen from FIG. 2 that each of the dice 24 is positioned in a cavity or depression formed by the arms 22 of the grid 20. This cavity can be filled with a layer of coating material made of a plastics material, which serves to enclose and protect the die 24. Thereafter a cover sheet (not shown) preferably formed of the same material as the base 10, may be secured over the grid 20 to form a protective cover (known as a "lid") for each of the chip carriers. Alternatively, a further layer of the coating material could be applied instead of a lid.

Once the dice 24 have been mounted and the appropriate protective covering has been applied, the whole array is then separated to form the individual chip carriers. This is done by cutting with a diamond saw along the centre lines of the arms 22 of the grid 20, on the axis X—X shown in FIG. 2. The resulting individual, leadless chip carriers can be mounted on printed circuit boards, together with other circuit components, using the pads 18 to interconnect to a preformed metallization pattern on the circuit board in known manner.

It can be seen that as the chip carrier can be made of conventional printed circuit board material eg, glass-/epoxy, it would be possible in some cases for the chip carrier to be formed integrally with a printed circuit board. In such a case, the grid 20 would be in the form of a single rectangle mounted on the upper surface of the printed circuit board. Alternatively, where the board is of multilayer laminated construction, the top layer of the board may be formed with a cut-out portion and the metallization pads 12 are formed on the next layer down such that when the top layer is laminated onto the rest of the board, the chip carrier is defined by a cavity in the upper surface of the board. The metallization pads 12 would be integral with the metallization pattern on the rest of the printed circuit board and the plated-throug metallization 16 and pads 18 would be dispensed with.

It can be appreciated that the mounting of the circuit dice 24 and the subsequent processing up to the point at which the individual chip carriers are separated is carried out with an array which is much easier to handle than are the individual chip carriers, and which can readily be processed by automatic assembly apparatus. In addition the formation of the base 10 and the grid 20 from conventional glass/epoxy printed circuit board material allows well tried and tested techniques to be used and also greatly reduces the cost of the final item.

The chip carriers in which the circuit dice are protected as described have exhibited high reliability in conditions of high humidity. Complete packages have been successfully tested at 90% relative humidity and 110° C. for 2,000 hours.

What we claim is:

1. A leadless chip carrier for physically mounting an integrated circuit chip and for providing electrical circuit connections thereto, said carrier comprising:

base of plastics material having edges about its periphery and having opposed top and bottom surfaces, a side wall of plastics material connected to the top surface of the base so as to be coterminus with at least part of the base periphery and extending about an enclosed area thereon so as to define an integrated chip mounting cavity on said base, and a pattern of metallized electrical contact areas formed on and supported by the top surface of said base and comprising a plurality of tracks of conductive material extending from first connecting points on said top surface within said chip mounting cavity around the edges of said base and on to second connecting points outside the chip mounting cavity located on the bottom surface of the base.

2. A leadless chip carrier as claimed in claim 1 wherein said tracks of conductive material extend along the edges of said base along substantially one-half portions of plated-through holes previously formed in a sheet of plastic material and then cut through along a predetermined boundary coincident with said periphery and edges of said base.

3. Apparatus for mechanically mounting an integrated circuit die within a protective cavity and for also providing electrical connections from the die to external electrical connection points outside the cavity, said apparatus comprising:

a base of plastics material having a top and bottom surface and having edge surfaces about the periphery of said base;

an array of individual metallized conductive strips disposed upon and bonded to the top of said base about a predetermined area on the base and extending away from said predetermined area around said dge surfaces via half-cylindrical conductive areas to contact pads, disposes on said bottom surface of the base and a side wall of plastics material substantially encompassing said predetermined area and substantially coterminus with said edge surfaces of the base said side wall being bonded to the top of said base sheet and to said array of conductive strips while leaving exposed the ends of said conductive strips which are directed inwardly toward said predetermined area to form said protective cavity within the side wall material at said predetermined area.

4. Apparatus as in claim 3 further comprising:

an integrated circuit die bonded to said base at said predetermined area; and electrically conductive wire connections extending from predetermined points on said integrated circuit die to the respectively corresponding inwardly directed ends of said conductive strips.

5. Apparatus as in claim 4 further comprising a filling of protective plastics material within said cavity covering said integrated circuit die and said wire connections.

6. Apparatus as in claim 4 or 5 further comprising a protective cover sheet of plastics material bonded to said side wall over said cavity.

* * * * *